(12) United States Patent
Andrews et al.

(10) Patent No.: US 6,924,659 B1
(45) Date of Patent: Aug. 2, 2005

(54) PROGRAMMABLE SIGNAL TERMINATION FOR FPGAS AND THE LIKE

(75) Inventors: William B. Andrews, Emmaus, PA (US); Mou C. Lin, High Bridge, NJ (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/628,657

(22) Filed: Jul. 28, 2003

(51) Int. Cl.[7] .............................................. H03K 17/16
(52) U.S. Cl. ............................ 326/30; 326/83; 326/86; 326/90; 327/108
(58) Field of Search ............................... 326/30, 86, 83, 326/90; 327/108–112

(56) References Cited

U.S. PATENT DOCUMENTS

| | | | |
|---|---|---|---|
| 6,452,420 B1 * | 9/2002 | Wong | 326/86 |
| 6,480,026 B2 | 11/2002 | Andrews et al. | 326/39 |
| 6,683,472 B2 * | 1/2004 | Best et al. | 326/30 |

OTHER PUBLICATIONS

U.S. Appl. No. 10/397,669, filed Mar. 26, 2003, Rahman et al.

"Multi-Drop LVDS with Virtex-E FPGAs". By Jon Burnetti and Brian Von Herzen, Xilinx XAPP231, Version 1.0, Sep. 23, 1999, pp. 1-11.

* cited by examiner

*Primary Examiner*—Vibol Tan
(74) *Attorney, Agent, or Firm*—Steve Mendelsohn (57) ABSTRACT

A termination scheme for the I/O circuitry of a programmable device, such as a field-programmable gate array (FPGA), has programmable resistors switchably connected between reference voltages and two of the device's I/O pads and additional programmable resistors switchably connected between the two I/O pads. By appropriately controlling the reference voltages and the resistance levels, a single implementation of the termination scheme can be used to conform to a relatively wide variety of symmetric and non-symmetric complementary and differential signaling applications.

19 Claims, 9 Drawing Sheets

Table I : Summary using on-chip termination schemes

| | Fig. 3 | Fig. 4 | Fig. 5 | External Impedance option | LVPECL SPEC |
|---|---|---|---|---|---|
| VDDIO | 2.5v | 2.5v | 3.3v | 3.3v | |
| output impedance up | 50 ohm | 20 ohm | 100 ohm | 100 ohm | |
| output impedance down | 50 ohm | 100 ohm | 100 ohm | 100 ohm | |
| Differential Impedance | Internal 100 ohm | Internal 100 ohm | Internal 100 ohm | External 200 ohm | |
| It | 16.7mA | 14.7mA | 13.2mA | 12.4mA | |
| Ir | 8.35mA | 7.35mA | 6.6mA | 4.1mA | |
| Id | 8.35mA | 7.35mA | 6.6mA | 8.3mA | |
| Voh | 1.670v | 2.206v | 1.980v | 2.06v | 1.975v - 2.720v |
| Vol | 0.835v | 1.470v | 1.320v | 1.24v | 1.190v - 1.980v |
| Vod | 0.835v | 0.740v | 0.660v | 0.830v | 0.600v - 1.000v |
| Vcm | 1.250v | 1.838v | 1.650v | 1.65v | 1.582v - 2.350v |
| driver power VDDIO*It | 41.8mW | 36.8mW | 43.6mW | 40.9mW | |

FIG. 6

| TABLE II | | | |
|---|---|---|---|
| ELEMENT | Fig. 3 | Fig. 4 | Fig. 5 |
| RT1 | 50 ohms | 20 ohms | 100 ohms |
| RT2 | 50 ohms | 100 ohms | 100 ohms |
| RC1 | 50 ohms | 20 ohms | 100 ohms |
| RC2 | 50 ohms | 100 ohms | 100 ohms |
| RDT | 50 ohms | 50 ohms | 50 ohms |
| RDC | 50 ohms | 50 ohms | 50 ohms |
| VT1 | 2.5V | 2.5V | 3.3V |
| VC1 | 2.5V | 2.5V | 3.3V |
| VT2 | 0V | 0V | 0V |
| VC2 | 0V | 0V | 0V |

PROGRAMMABLE SIGNAL TERMINATION FOR FPGAS AND THE LIKE

TECHNICAL FIELD

The present invention relates to programmable devices, such as field-programmable gate arrays (FPGAs), and, in particular, to the input/output (I/O) interfaces for such devices.

BACKGROUND

Field-programmable gate arrays are a particular type of programmable device that provides functional flexibility to the user. As opposed to an application-specific integrated circuit (ASIC) or other similar device in which the functionality is "hard-wired" in the device, an FPGA allows a user to program the device to support a relatively wide range of functionality. One of the main advantages of FPGAs over ASICs is that a single FPGA hardware design can provide user-programmable functionality to support many different applications, while an ASIC is limited to the particular functions that are hard-wired into the device at the time of fabrication.

In order to communicate with other components, an FPGA must be able to transmit outgoing signals to and/or receive incoming signals from those other components. There are many different signaling standards in use today that define protocols for signal communications between components. For example, different signaling standards may rely on symmetric or non-symmetric differential or complementary signaling having different sets of voltage levels corresponding to data true, data complement, and the intermediate common-mode voltage.

For purposes of this specification, complementary signaling corresponds to signaling whose DC specifications correspond to full-swing (i.e., rail-to-rail) signaling between a high power-supply voltage Vdd and a low power-supply voltage Vss, where, under DC conditions, a data value of 1 corresponds to Vdd appearing at a true I/O pad and Vss appearing at a complement I/O pad, while a data value of 0 corresponds to Vss appearing at the true pad and Vdd appearing at the complement pad. Differential signaling, on the other hand, corresponds to reduced-swing signaling in which, under DC conditions, the high and low voltage levels (Voh and Vol) appearing at the true and complement pads for data 1 and data 0 fall between the power-supply voltages Vdd and Vss. Thus, assuming DC conditions, in complementary signaling, Vdd=Voh>Vol=Vss, while, in differential signaling, Vdd>Voh>Vol>Vss. Note that, under high-speed AC conditions, the Voh and Vol levels of complementary signaling may fail to reach the full-swing, rail-to-rail signal levels Vdd and Vss.

Symmetric signaling refers to signaling in which the midpoint between the high and low voltage levels Voh and Vol (e.g., the common-mode voltage Vcm) is the same as the midpoint between the high and low power-supply voltages Vdd and Vss, while non-symmetric signaling refers to signaling in which Vcm is not midway between Vdd and Vss (or, in another possible type of non-symmetry, not midway between Vdd and Vss). In general, both complementary and differential signaling can be either symmetric or non-symmetric.

A particular signal-processing system might conform to a particular signaling standard for its inter-component communications. In that case, all of the components in the system would ideally be compatible with that particular signaling standard so that all inter-component communications within the system would conform to that signaling standard.

In the past, an FPGA would be designed to operate in systems that conform to a particular signaling standard. Such an FPGA would be able to transmit and/or receive signals conforming to that particular signaling standard. In order for that same FPGA to be configured to operate in a system that conforms to some other signaling standard, additional hardware, external to the FPGA (e.g., a board-level discrete device), would have to be provided in order to convert (1) incoming signals (i.e., signals transmitted to the FPGA from other system components) from the system's signaling standard to the different signaling standard supported by the FPGA and (2) outgoing signals (i.e., signals transmitted from the FPGA and intended for other system components) from the FPGA's signaling standard to the system's different signaling standard. Alternatively, a different FPGA would have to be designed to support the system's different signaling standard.

SUMMARY

Problems in the prior art are addressed in accordance with the principles of the present invention by a programmable device, such as a field-programmable gate array, having programmable I/O circuitry that supports a relatively wide variety of different signaling standards. Embodiments of the present invention enable signal voltage-level manipulation and increased termination capability through the use of on-chip device structures that allow the device to meet numerous differential and complementary signaling standards as well as minor signaling variations on a per pin basis. Selectably using either a differential or a complementary buffer structure with programmable output levels and an attenuation structure with multiple, flexible programmability options, embodiments of the present invention allow signals to be controlled and/or attenuated to meet the increasing number of signaling standards in use today, thereby providing a device that can be employed for a relatively wide range of applications. For example, an embodiment of the present invention may be able to convert a typical set of complementary signals running at full-swing levels to an equivalent differential set of signals running at a reduced swing, where the complementary and/or differential signals may correspond to either a symmetric or a non-symmetric set of signal levels.

In one embodiment, the present invention is a programmable device having programmable input/output (I/O) circuitry and programmable logic connected to receive incoming signals from and provide outgoing signals to the I/O circuitry. The I/O circuitry can be programmed to function in an independent mode of operation in which first and second pads of the programmable device operate independent of one another. The I/O circuitry can be programmed to function in one or more dependent modes of operation in which a pair of related signals appear at the first and second pads, respectively.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

FPGA Architecture

Figure 1:
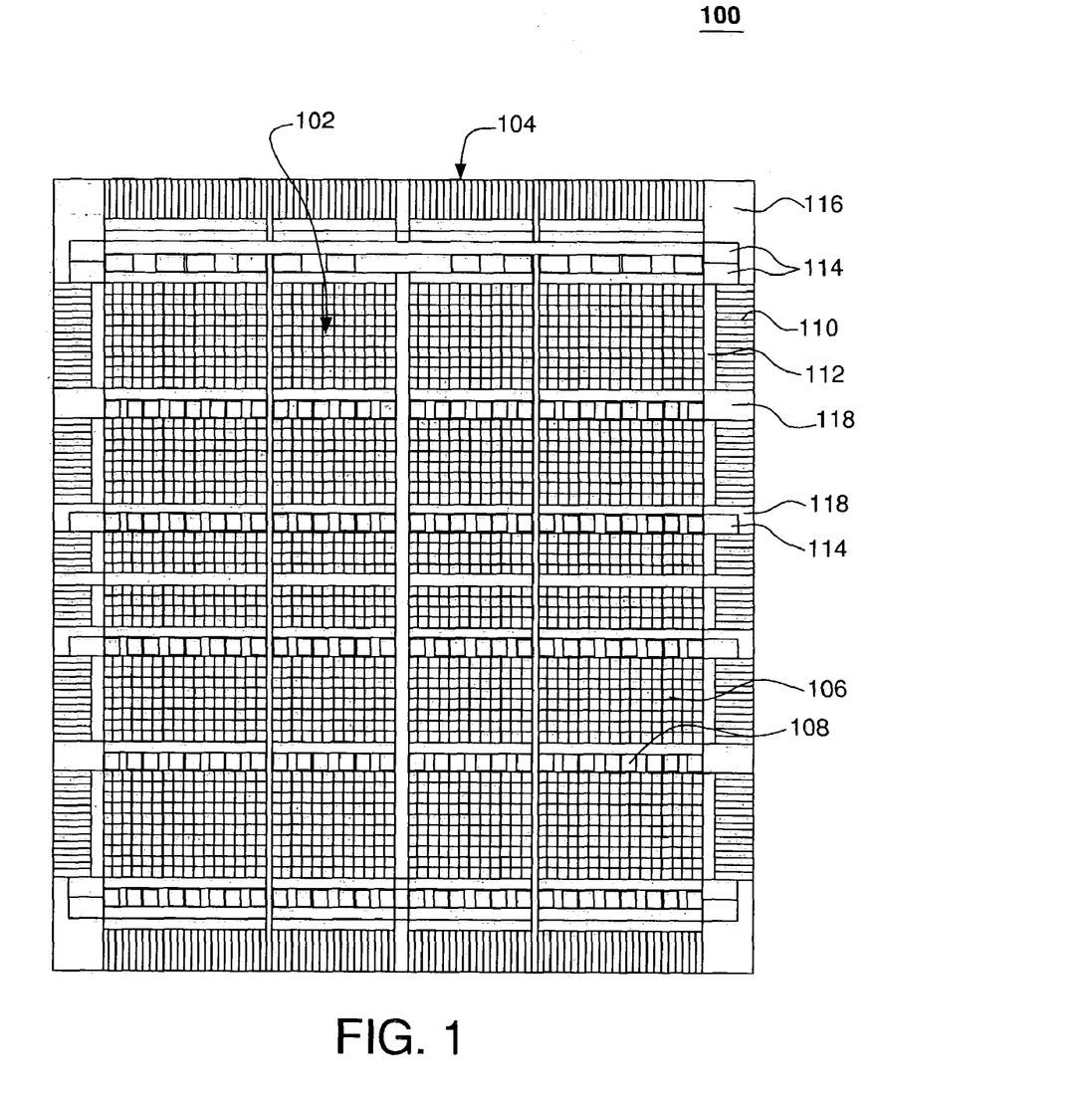
FIG. 1 shows a high-level block diagram of the layout of an exemplary FPGA of the present invention.

FIG. 1 shows a high-level block diagram of the layout of an exemplary FPGA 100 of the present invention, having a logic core 102 surrounded by an input/output (I/O) ring 104. Logic core 102 includes an array of programmable logic blocks (PLBs) 106 intersected by rows of block memory 108. Each PLB contains circuitry that can be programmed to perform a variety of different functions. The memory blocks in each row are available to store data to be input to the PLBs and/or data generated by the PLBs. I/O ring 104 includes sets of I/O buffers 110 programmably connected to the logic core by multiplexor/demultiplexor (mux/demux) circuits 112. The I/O buffers support external interfacing to FPGA 100. Also located within the I/O ring are a number of phase-locked loop (PLL) circuits 114 that are capable of providing different timing signals for use by the various elements within FPGA 100. Those skilled in the art will understand that FPGAs, such as FPGA 100, will typically include other elements, such as configuration memory, that are not shown in the high-level block diagram of FIG. 1. In addition, general routing resources, including clocks, buses, general-purpose routing, high-speed routing, etc. (also not shown in FIG. 1), are provided throughout the FPGA layout to programmably interconnect the various elements within FPGA 100.

The layout of an FPGA, such as FPGA 100 of FIG. 1, comprises multiple instances of a limited number of different types of blocks of circuitry. For example, an I/O ring may contain a number of instances of the same basic block of circuitry repeated around the periphery of the device. In the example of FPGA 100, I/O ring 104 is made up of multiple instances of the same basic programmable I/O circuit (PIC), where each PIC provides a particular number (e.g., three) of the I/O buffers of the I/O ring.

Termination Scheme Architecture

Figure 2:
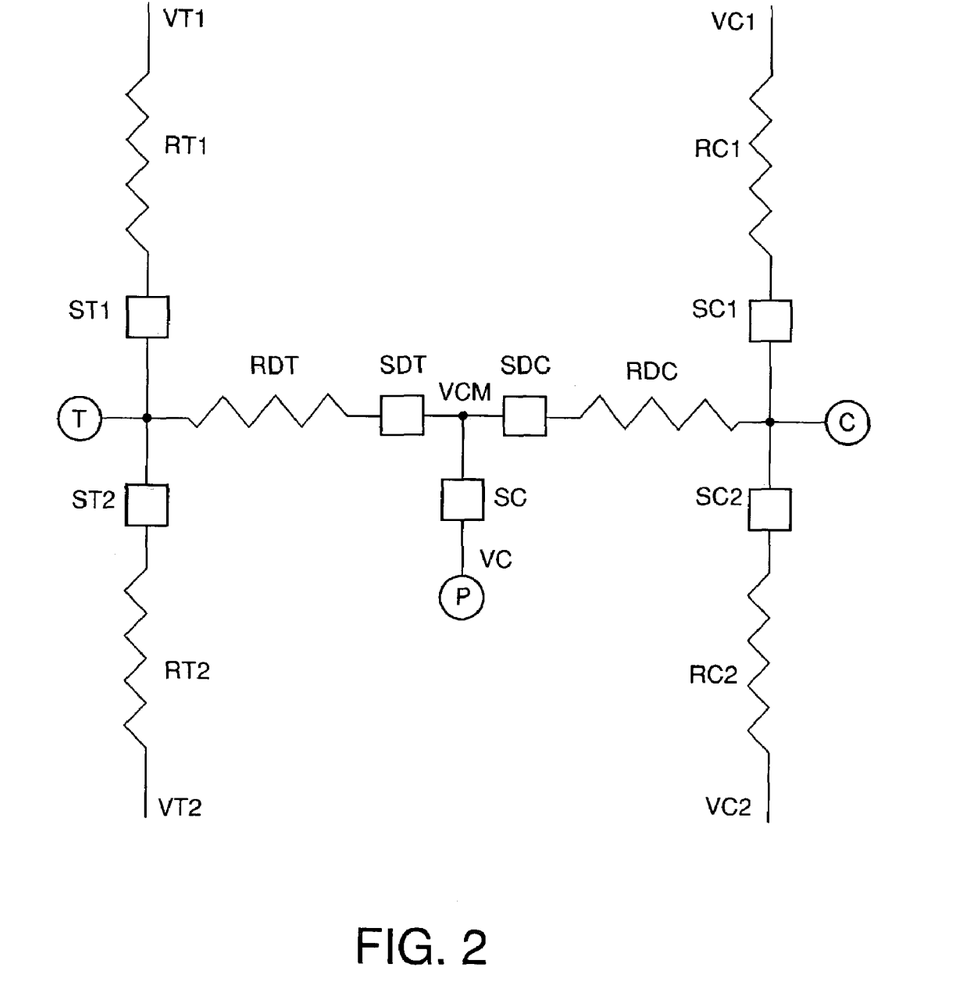
FIG. 2 shows a high-level schematic diagram of the termination scheme employed in the PICs of the FPGA of FIG. 1, according to one embodiment of the present invention.

FIG. 2 shows a high-level schematic diagram of the termination scheme employed in the PICs of FPGA 100, according to one embodiment of the present invention. The termination scheme of FIG. 2 relies on a configuration of programmable impedances (e.g., resistors) separated by switches that control the interconnections between the impedances.

In particular, the termination scheme of FIG. 2 provides programmable, resistive interconnections between three bidirectional I/O pads (T, C, and P) and four terminals (VT1, VT2, VC1, VC2), which can be used to apply four different programmable reference voltage levels. In an exemplary programmed configuration for the termination scheme of FIG. 2, pad T can be used to present a true (T) signal, pad C can be used to present a complement (C) signal, and pad P can be used as a common mode (CM) voltage termination or connection point. Depending on the particular signaling application, VT1 and VC1 may be (but do not have to be) set to the same (high) power-supply voltage level Vdd, and VT2 and VC2 may be (but do not have to be) set to the same (low) power-supply voltage level Vss (e.g., ground).

Switch ST1 selectably connects terminal VT1 to pad T through programmable resistor RT1. Switch ST2 selectably connects terminal VT2 to pad T through programmable resistor RT2. Switch SDT selectably connects pad T to common mode voltage node VCM through programmable resistor RDT.

Similarly, switch SC1 selectably connects terminal VC1 to pad C through programmable resistor RC1. Switch SC2 selectably connects terminal VC2 to pad C through programmable resistor RC2. Switch SDC selectably connects pad C to common mode voltage node VCM through programmable resistor RDC.

Lastly, switch SC selectably connects pad P to common mode voltage node VCM.

Those skilled in the art will understand that, in alternative embodiments, one or more of the series combinations of switch and resistor can be reversed in an alternative embodiment of the termination scheme of FIG. 2, depending on specific design requirement dependencies. For example, instead of (a) RT1 being connected between VT1 and ST1 and (b) ST1 being connected between RT1 and pad T, the order could be reversed with (a) ST1 being connected between VT1 and RT1 and (b) RT1 being connected between ST1 and pad T. In preferred implementations, the impedances of the switches are a fraction of the impedances of the corresponding resistors in order to reduce the affects of switch-impedance variations on the total resistance.

The programmable termination scheme of FIG. 2 supports a relatively wide range of different signaling schemes. Depending on the particular implementation, the impedance of each programmable resistor (RT1, RT2, RDT, RC1, RC2, RDC), the state of each switch (ST 1, ST2, SDT, SC1, SC2, SDC, SC), and the reference voltage applied to each terminal (VT1, VT2, VC1, VC2) can be individually controlled by one or more process control circuits (not shown in FIG. 2). By adjusting the reference voltage levels, the impedance levels, and the switch settings, the thevenin equivalent impedance can take on a number of different values for different termination schemes, and the differential or complementary output drive characteristics can be manipulated as reduced-swing symmetric or non-symmetric wave forms. The programmable termination scheme of FIG. 2 can be used for amplitude modification of signals at either the driving end or the receiving end of a communication path.

In alternative applications, one or more of terminals VT1, VT2, VC1, and VC2 could have data signals applied to them instead of reference voltages. For example, if switches ST1, SDT, SDC, and SC2 are closed; switches ST2, SC, and SC1 are open; and terminal VC2 is connected to ground, then the termination scheme of FIG. 2 will function as a signal attenuator when a data signal is applied to terminal VT1, where attenuated signals will appear at pads T and C, whose magnitudes will depend on the relative resistance levels of RT1, RDT, RDC, and RC2.

An advantage of this termination scheme is that new signal interface standards can be more easily emulated using existing single-ended output buffers. The termination scheme allows single-ended drivers to emulate differential and complementary drive and termination schemes using a low-cost, on-chip component scheme, while prior art schemes would require a different driver or high-cost, external, discrete complex components or a combination thereof. Since all of the components in the present invention are preferably co-located within the same device, the present invention allows the programmable termination to be temperature- and process-independent.

Exemplary Signaling Applications

Figure 3:
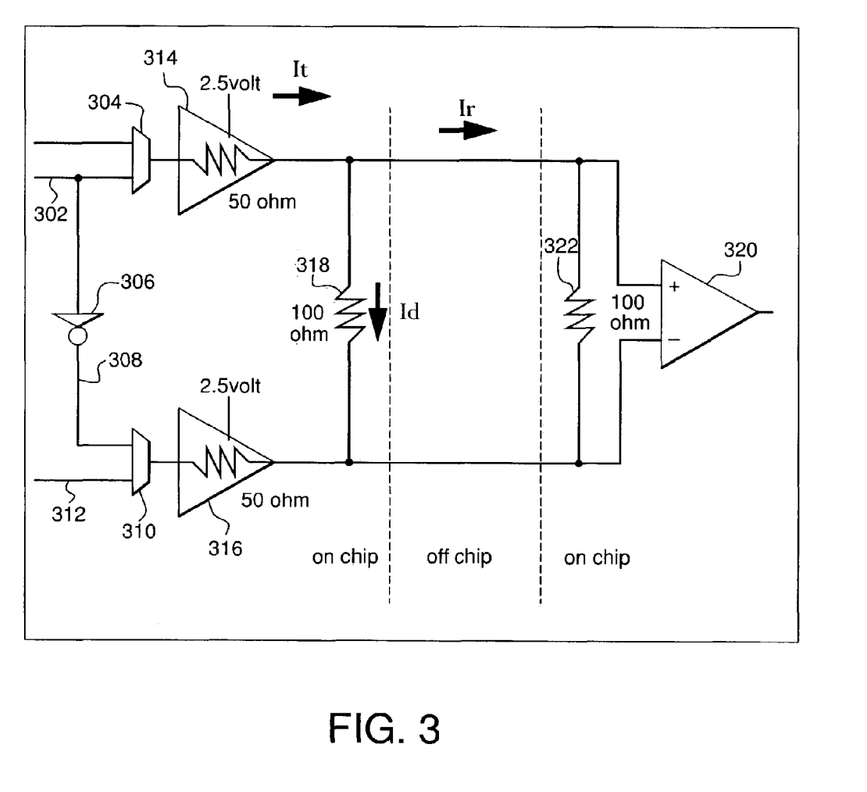
FIGS. 3–5 show schematic diagrams of three different signaling applications supported by the termination scheme of FIG. 2.
Figure 4:
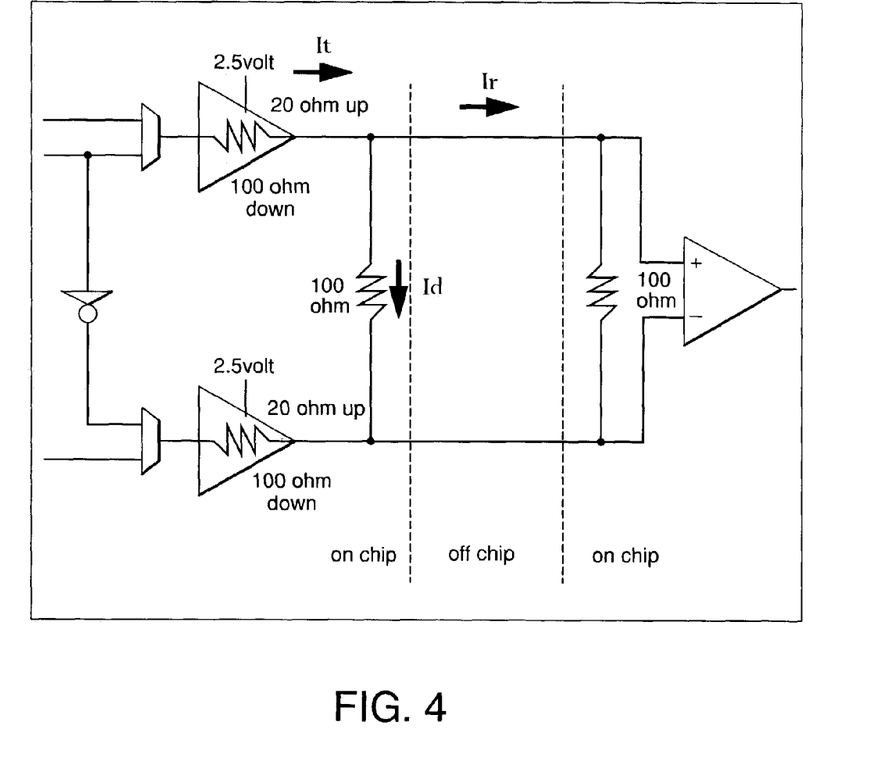
Figure 5:
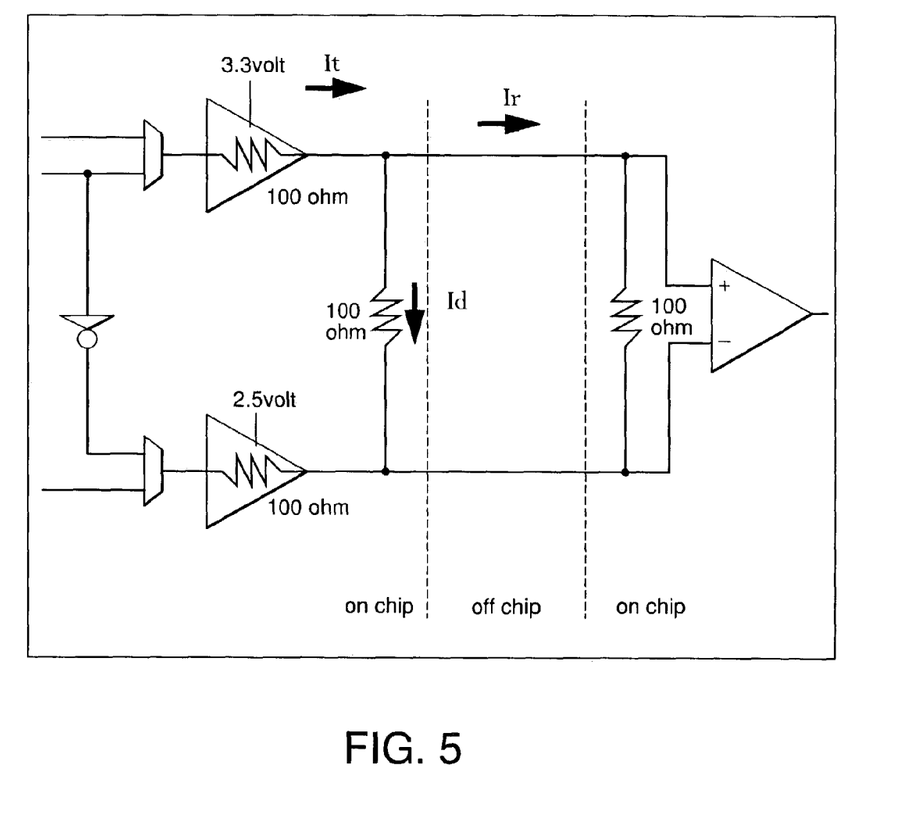

FIGS. 3–5 show schematic diagrams of three different signaling applications supported by the termination scheme of FIG. 2. In each of these signaling applications, a pair of push-pull output buffers drives a differential signal pair to a (remote) receiver through an amplitude adjustment scheme.

In particular, referring to FIG. 3, binary data signal 302 is applied to mux 304 and inverter 306, which generates inverted binary data signal 308, which is itself applied to mux 310, which can also receive a different binary data signal 312. The outputs of muxes 304 and 310 are applied to push-pull output buffers 314 and 316, respectively. In the current differential signaling application, mux 310 is configured to apply inverted binary data signal 308 to output buffer 316. As such, the differential outputs of buffers 314 and 316 are driven off-chip across on-chip differential output impedance 318 towards differential receiver 320 having a 100-ohm differential input impedance 322. The same basic configuration applies to the signaling applications of FIGS. 4 and 5. The differences between these three signaling applications lie in the different reference voltage levels and in the different up and down impedances of the push-pull output buffers. FIGS. 3 and 5 are examples of symmetric signaling where Vcm is midway between Vdd and Vss (assumed to be 0V), while FIG. 4 is an example of non-symmetric signaling where Vcm is not midway between Vdd and Vss.

By configuring mux 310 to select binary data signal 312, the termination scheme of FIG. 2 can be configured to support complementary signaling applications. In a preferred implementation, the other input to mux 304 is tied off. In that case, the presence of mux 304 ensures that data signal 302 and inverted data signal 308 travel along equivalent signaling paths in order to maintain proper phase relationship between the differential signals. In complementary signaling applications, PLLs and/or other phase-control circuits implemented on the FPGA can be used to control the phase relationship between the two complementary signals 302 and 312. Such phase-control circuitry can also be used to compensate for mismatch board skew between pads C and T.

Figure 6:
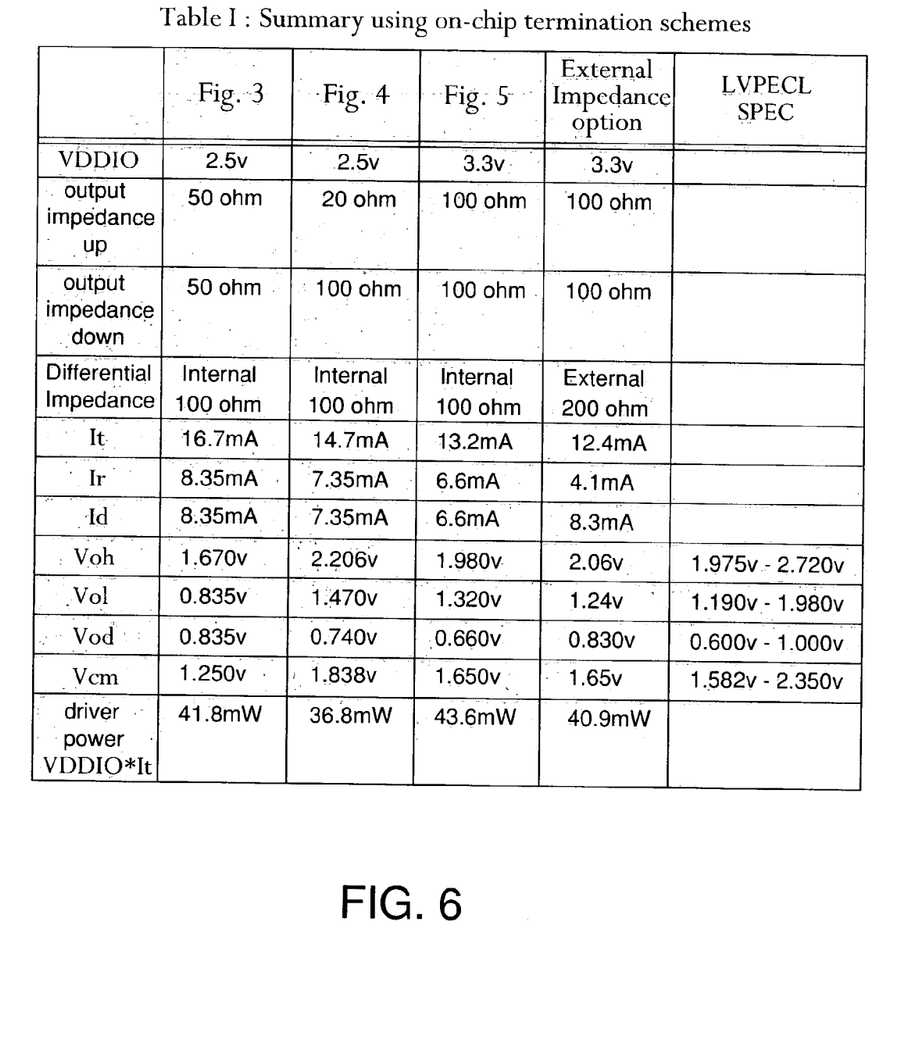
FIG. 6 shows Table I, which summarizes the various signal characteristics for the signaling applications of FIGS. 3–5.

Table I of FIG. 6 summarizes the various signal characteristics for the signaling applications of FIGS. 3–5. In addition, Table I shows the various levels for an exemplary prior-art termination scheme in which the differential impedance across the outputs of the output buffers is implemented off-chip. The last column of Table 1 shows the high, low, differential, and common-mode voltage ranges for conformance with the LVPECL (Low-Voltage Pseudo Emitter-Coupled Logic) signaling standard. Note that the signaling applications of FIGS. 4 and 5, as well as the prior-art application, all meet the LVPECL signaling requirements. It will be understood that, the present invention can be implemented using other combinations of resistances and voltages to meet the LVPECL signaling standard, which moreover is only one of many different signaling applications that can be supported by implementations of the present invention.

Figure 7:
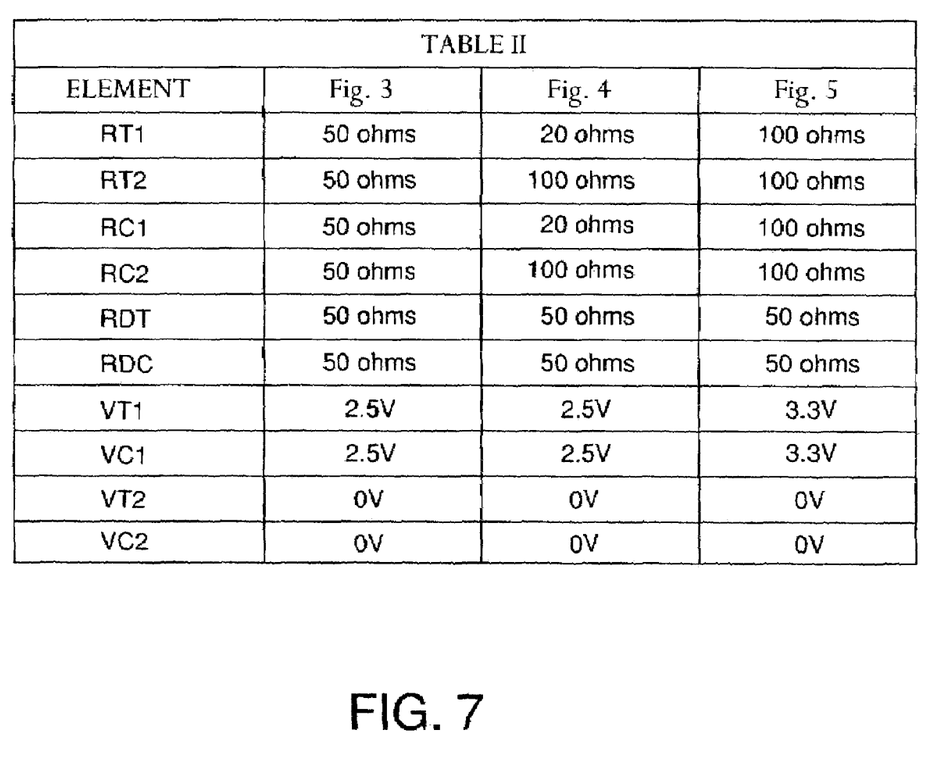
FIG. 7 shows Table II, which shows how to configure each of the programmable resistors and reference voltages in the termination scheme of FIG. 2 to support each of the signaling applications of FIGS. 3–5.

The termination scheme of FIG. 2 can be programmably configured to support each of the signaling applications of FIGS. 3–5 (as well as many others). Table II of FIG. 7 shows how to configure each of the programmable resistors and reference voltages in the termination scheme of FIG. 2 to support each of the signaling applications of FIGS. 3–5. For all three applications, switches SDT and SDC are closed. In addition, switch SC may be closed to enable node VCM to provide a common-mode voltage termination or connection, for example, when multiple instances of the termination scheme are connected to the same external capacitor via their pads P.

For example, for the signaling application of FIG. 3, when switches ST1 and SC2 of FIG. 2 are closed and switches ST2 and SC1 are open, the voltage at pad T will be about 1.670V (corresponding to the desired high output voltage level Voh for the signaling application) and the voltage at pad C will be about 0.835V (corresponding to the signaling application's desired low output voltage level Vol). Similarly, when switches ST1 and SC2 are open and switches ST2 and SC1 are closed, the voltage at pad T will be about 0.835V (corresponding to Vol) and the voltage at pad C will be about 1.670V (corresponding to Voh). In both these cases, the magnitude of the voltage difference between pad T and pad C will be about 0.835V (corresponding to the desired output differential voltage level Vod of the signaling application), while the voltage at node VCM will be about 1.250V (corresponding to the desired common-mode voltage level for the signaling application). Thus, the elements of the termination scheme of FIG. 2 can be appropriately configured to provide the signaling application of FIG. 3. In analogous manner, the termination scheme of FIG. 2 can also be configured to provide the signaling applications of FIGS. 4 and 5.

Note that, in each of these three examples, the termination at the receiver (320 in FIG. 3) can also be provided by another instance of the termination scheme of the present invention.

Implementation Details

Figure 8:
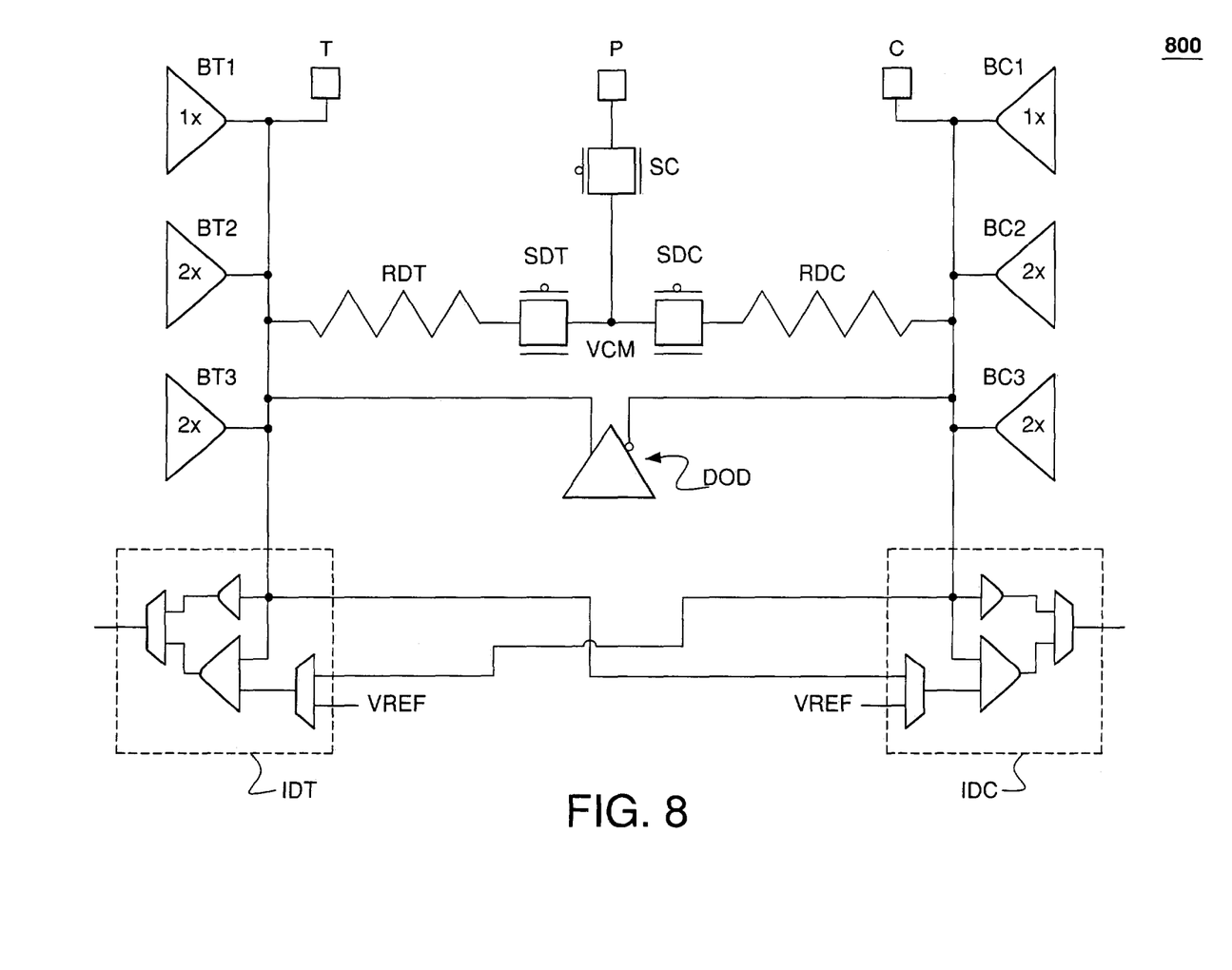
FIG. 8 shows a schematic diagram of I/O circuitry, according to one possible implementation of the termination scheme of FIG. 2.

FIG. 8 shows a schematic diagram of I/O circuitry 800, according to one possible implementation of the termination scheme of FIG. 2. FIG. 8 shows pads T, C, and P; programmable resistors RDT and RDC; and switches SDT, SDC, and SC, all corresponding to analogous elements in FIG. 2. In FIG. 8, the two programmable, push-pull buffers formed by RT1, ST1, ST2, and RT2 and by RC1, SC1, SC2, and RC2, respectively, of FIG. 2, are implemented by two sets of individually programmable, push-pull buffers BT1–BT3 and BC1–BC3, respectively. In the particular implementation of FIG. 8, buffers BT2, BT3, BC2, and BC3 are implemented using twice the number of resistors and therefore provide half the impedance as buffers BT1 and BC1. In addition, I/O circuitry 800 has differential output driver DOD and true and complement input drivers (i.e., receivers) IDT and IDC.

With the elements shown in FIG. 8, I/O circuitry 800 is able to support a number of different termination schemes. For example, with buffers BT1–BT3 and BC1–BC3 and receivers IDT and IDC disabled, differential output driver DOD is capable of driving a symmetric pair of outgoing signals onto pads T and C. Similarly, with buffers BT1–BT3 and BC1–BC3 and output driver DOD disabled, receivers IDT and IDC are capable of receiving a pair of incoming signals from pads T and C. The present invention can be implemented using either unidirectional or bidirectional output circuits, where the output devices could be tri-statable.

With output driver DOD disabled, buffers BT1–BT3 and BC1–BC3 are capable of supporting the wide range of different termination schemes described previously in the context of FIGS. 1–7. For example, by selectively enabling different combinations of buffers, termination schemes corresponding to 1x, 2x, 3x, 4x, and 5x can all be implemented, where 1x refers to the maximum impedance of buffers BT1 and BC1. It will be understood that different and/or additional buffers could be implemented to achieve additional combinations.

Figure 9:
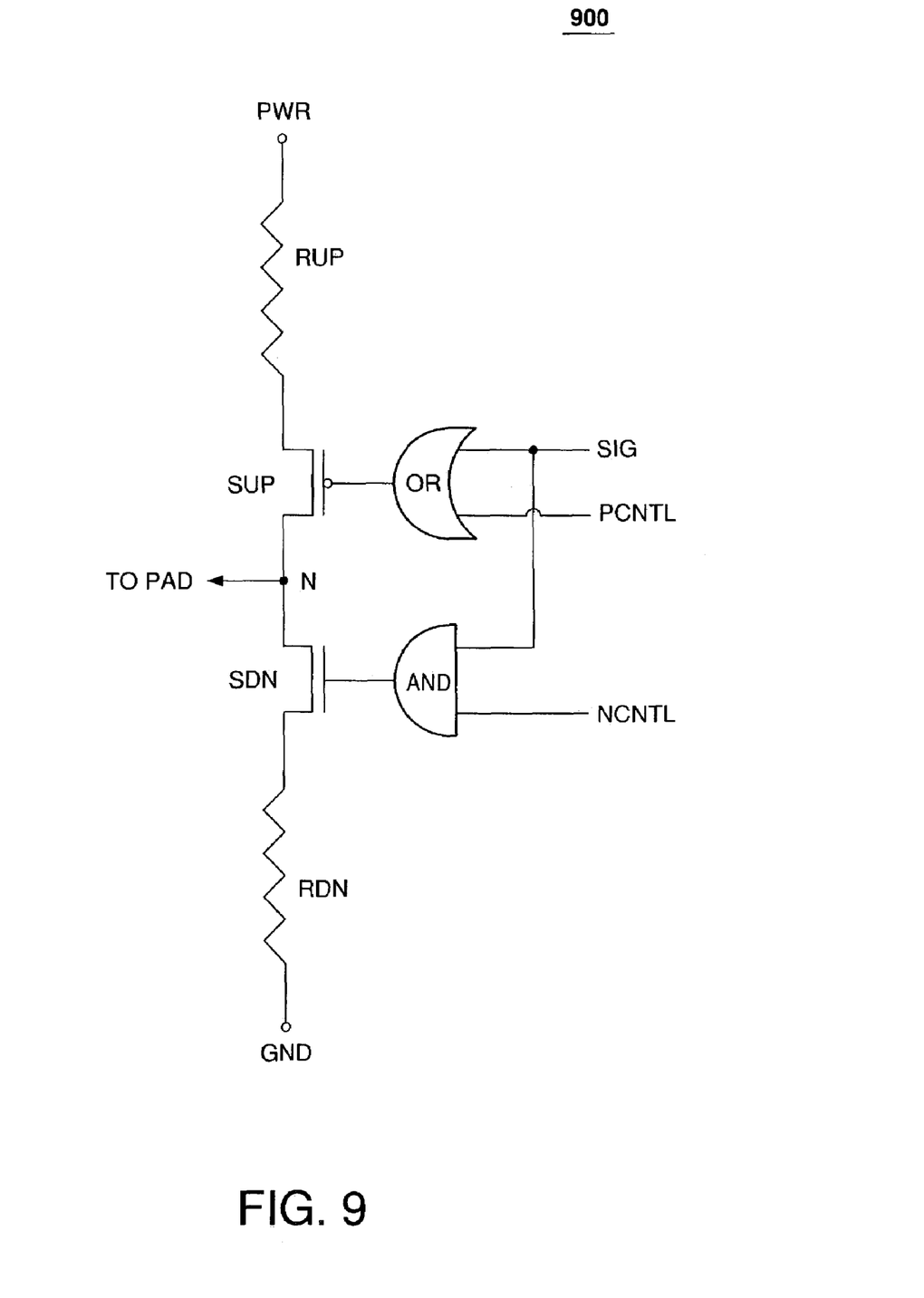
FIG. 9 shows a schematic diagram of a push-pull buffer architecture that can be used to implement each of buffers BT1–BT3 and BC1–BC3 of FIG. 8.

FIG. 9 shows a schematic diagram of a push-pull buffer architecture HA that can be used to implement each of buffers BT1–BT3 and BC1–BC3 of FIG. 8. As shown, buffer HA has a programmable "up" resistor RUP connected between a (e.g., high) power-supply voltage PWR and one channel terminal of an "up" switch SUP, whose other channel terminal is connected to node N, which connects buffer HA to a corresponding I/O pad. In addition, buffer HA has a programmable "down" resistor RDN connected between a (e.g., low) power-supply voltage GND and one channel terminal of a "down" switch SDN, whose other channel terminal is connected to node N. For buffers BT1 and BC1 of FIG. 8, each programmable resistor (RUP and RDN) has half the maximum resistance as each programmable resistor used in BT2–BT3 and BC2–BC3.

The states of switches SUP and SDN are controlled by two control signals PCNTL and NCNTL and binary data signal SIG. With PCNTL set to logic 0 and NCNTL set to logic 1, data signal SIG will control switches SUP and SDN such that, when SIG is at logic 1, switch, SUP will be closed and switch SDN will be open, and, when SIG is at logic 0, SUP will be open and SDN will be closed. When SUP is closed and SDN is open, voltage PWR is connected to the pad through programmable resistor RUP. Similarly, when SUP is open and SDN is closed, voltage GND is connected to the pad through programmable resistor RDN.

The control signals PCNTL and NCNTL can also be used to disable some or all of buffer HA. In particular, if PCNTL is set to logic 1, then switch SUP will always be open, thereby ensuring that voltage PWR is disconnected from node N independent of the value of SIG. Similarly, if NCNTL is set to logic 0, then switch SDN will always be open, thereby ensuring that voltage GND is disconnected from node N independent of the value of SIG.

For buffers BT1–BT3, PWR is VT1 of FIG. 2 and GND is VT2, while, for buffers BC1–BC3, PWR is VC1 and GND is VC2. In a preferred implementation, when true buffer BTx is driven by binary data signal SIG, the corresponding complement buffer BCx is preferably driven by the corresponding inverted data signal SIGN.

The programmable resistors used in the present invention can be implemented using any suitable design. In a preferred implementation, the programmable resistors are based on the teachings related to programmable differential resistor circuits in U.S. Pat. No. 6,480,026, the teachings of which are incorporated herein by reference.

Although the present invention has been described in the context of resistive impedances, it will be understood that, in addition or alternatively, each different impedance may have capacitive and/or inductive components. Furthermore, although the present invention was described in the context of implementations having resistance levels of about 20, 50, and 100 ohms, it should be understood that the present invention can implemented with any suitable resistance levels.

Although the present invention has been described in the context of FPGAs, those skilled in the art will understand that the present invention can be implemented in the context of other types of programmable devices, such as, without limitation, programmable logic devices (PLDs) and mask-programmable gate arrays (MPGAs).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. A programmable device having programmable input/output (I/O) circuitry and programmable logic connected to receive incoming signals from and provide outgoing signals to the I/O circuitry, wherein:
   the I/O circuitry can be programmed to function in an independent mode of operation in which first and second pads of the programmable device operate independent of one another; and
   the I/O circuitry can be programmed to function in two or more dependent modes of operation in which a pair of related signals appear at the first and second pads, respectively, wherein the two or more dependent modes of operation have different combinations of high, low, common mode, and differential voltage levels.

2. The invention of claim 1, wherein:
   the programmable device is an FPGA; and
   the dependent modes of operation include both signal-driving and signal-receiving modes of operation.

3. The invention of claim 1, wherein, for the first and second pads, the I/O circuitry comprises:
   (a) a first programmable impedance switchably connected between the first pad and a first terminal;
   (b) a second programmable impedance switchably connected between the first pad and a second terminal;
   (c) a third programmable impedance switchably connected between the second pad and a third terminal;

(d) a fourth programmable impedance switchably connected between the second pad and a fourth terminal; and (e) a fifth programmable impedance switchably connected between the first pad and the second pad.

4. The invention of claim 3, wherein each programmable impedance is a programmable resistor.

5. The invention of claim 3, wherein each programmable impedance is independently programmable.

6. The invention of claim 3, wherein a third pad of the programmable device is switchably connected to a node along the switchable connection between the first and second pads.

7. The invention of claim 6, wherein:
a first part of the fifth programmable impedance is switchably connected between the first pad and the node; and
a second part of the fifth programmable impedance is switchably connected between the second pad and the node.

8. The invention of claim 3, wherein:
the first programmable impedance and the second programmable impedance can be programmably operated as a first push-pull buffer;
the third programmable impedance and the fourth programmable impedance can be programmably operated as a second push-pull buffer;
the first push-pull buffer is implemented as a combination of two or more smaller programmable push-pull buffers; and
the second push-pull buffer is implemented as a combination of two or more smaller programmable push-pull buffers.

9. The invention of claim 3, wherein reference voltages or data signals can be independently applied to each terminal.

10. The invention of claim 1, wherein the dependent modes of operation include both differential and complementary modes of operation.

11. The invention of claim 1, wherein the dependent modes of operation include both symmetric and non-symmetric modes of operation.

12. The invention of claim 1, wherein the dependent modes of operation include both differential and complementary modes of operation, both signal-driving and signal-receiving modes of operation, and both symmetric and non-symmetric modes of operation.

13. The invention of claim 1, wherein:
the programmable device is an FPGA;
for the first and second pads, the I/O circuitry comprises:
(a) a first programmable resistor switchably connected between the first pad and a first terminal;
(b) a second programmable resistor switchably connected between the first pad and a second terminal;
(c) a third programmable resistor switchably connected between the second pad and a third terminal;
(d) a fourth programmable resistor switchably connected between the second pad and a fourth terminal; and
(e) a fifth programmable resistor switchably connected between the first pad and the second pad;
each programmable resistor is independently programmable;
a third pad of the programmable device is switchably connected to a node along the switchable connection between the first and second pads;
a first part of the fifth programmable resistor is switchably connected to the node;

a second part of the fifth programmable resistor is switchably connected to the node;
the first programmable resistor and the second programmable resistor can be programmably operated as a first push-pull buffer;
the third programmable resistor and the fourth programmable resistor can be programmably operated as a second push-pull buffer;
the first push-pull buffer is implemented as a combination of two or more smaller programmable push-pull buffers;
the second push-pull buffer is implemented as a combination of two or more smaller programmable push-pull buffers;
reference voltages or data signals can be independently applied to each terminal; and
the dependent modes of operation include both differential and complementary modes of operation, both signal-driving and signal-receiving modes of operation, and both symmetric and non-symmetric modes of operation.

14. A programmable termination circuit integrated within a programmable device and adapted to provide programmable, resistive interconnections between input/output (I/O) pads of the programmable device, the termination circuit comprising:
a plurality of programmable resistors;
a plurality of programmable switches connecting the programmable resistors; and
a plurality of voltage terminals connected to at least some of the programmable resistors and adapted to receive one or more a programmable reference voltages, wherein, for first and second I/O pads, the programmable termination circuit comprises:
(a) a first programmable impedance switchably connected between the first pad and a first terminal;
(b) a second programmable impedance switchably connected between the first pad and a second terminal;
(c) a third programmable impedance switchably connected between the second pad and a third terminal;
(d) a fourth programmable impedance switchably connected between the second pad and a fourth terminal; and
(e) a fifth programmable impedance switchably connected between the first pad and the second pad, wherein a third pad of the programmable device is switchably connected to a node along the switchable connection between the first and second pads.

15. The invention of claim 14, wherein:
the first programmable impedance and the second programmable impedance can be programmably operated as a first push-pull buffer;
the third programmable impedance and the fourth programmable impedance can be programmably operated as a second push-pull buffer;
the first push-pull buffer is implemented as a combination of two or more smaller programmable push-pull buffers; and
the second push-pull buffer is implemented as a combination of two or more smaller programmable push-pull buffers.

16. A programmable device having programmable input/output (I/O) circuitry and programmable logic connected to receive incoming signals from and provide outgoing signals to the I/O circuitry, wherein:
the I/O circuitry can be programmed to function in an independent mode of operation in which first and second pads of the programmable device operate independent of one another; and the I/O circuitry can be programmed to function in one or more dependent modes of operation in which a pair of related signals appear at the first and second pads, respectively, wherein, for the first and second pads, the I/O circuitry comprises:

(a) a first impedance switchably connected between the first pad and a first terminal;

(b) a second impedance switchably connected between the first pad and a second terminal;

(c) a third impedance switchably connected between the second pad and a third terminal;

(d) a fourth impedance switchably connected between the second pad and a fourth terminal;

(e) a fifth impedance switchably connected between the first pad and the second pad; and (f) a third pad switchably connected to a node along the switchable connection between the first and second pads.

17. The invention of claim 16, wherein each impedance is a programmable impedance.

18. A programmable device having programmable input/output (I/O) circuitry and programmable logic connected to receive incoming signals from and provide outgoing signals to the I/O circuitry, wherein:

the I/O circuitry can be programmed to function in an independent mode of operation in which first and second pads of the programmable device operate independent of one another; and the I/O circuitry can be programmed to function in one or more dependent modes of operation in which a pair of related signals appear at the first and second pads, respectively, wherein, for the first and second pads, the I/O circuitry comprises:

(a) a first impedance switchably connected between the first pad and a first terminal;

(b) a second impedance switchably connected between the first pad and a second terminal;

(c) a third impedance switchably connected between the second pad and a third terminal;

(d) a fourth impedance switchably connected between the second pad and a fourth terminal; and (e) a fifth impedance switchably connected between the first pad and the second pad, wherein:

the first impedance and the second impedance can be operated as a first push-pull buffer;

the third impedance and the fourth impedance can be operated as a second push-pull buffer;

the first push-pull buffer is implemented as a combination of two or more smaller push-pull buffers; and the second push-pull buffer is implemented as a combination of two or more smaller push-pull buffers.

19. The invention of claim 18, wherein each impedance is a programmable impedance.

* * * * *